United States Patent [19]

Powell

[11] Patent Number: 4,725,204

[45] Date of Patent: Feb. 16, 1988

[54] VACUUM MANIFOLD PUMPING SYSTEM

[75] Inventor: Harold R. Powell, Montgomery County, Pa.

[73] Assignee: Pennwalt Corporation, Philadelphia, Pa.

[21] Appl. No.: 927,199

[22] Filed: Nov. 5, 1986

[51] Int. Cl.[4] .................... F04B 23/12; F04B 49/00; C23C 16/00
[52] U.S. Cl. .................... 417/205; 417/248; 417/306; 417/427; 417/441; 118/50; 118/715; 118/719; 118/725
[58] Field of Search ................ 417/2, 3, 5, 69, 199 R, 417/205, 426, 427, 244, 248, 306, 441; 418/3, 9; 137/566; 118/50, 715, 719, 725

[56] References Cited

U.S. PATENT DOCUMENTS

| | | | |
|---|---|---|---|
| 2,358,067 | 9/1944 | Hickman | 417/152 |
| 2,620,969 | 12/1952 | Stephens | 417/441 X |
| 2,887,618 | 5/1959 | Reid | 417/205 X |
| 2,971,691 | 2/1961 | Lorenz | 417/69 |
| 2,996,410 | 8/1961 | Hnilicka, Jr. | 118/719 X |
| 3,007,624 | 11/1961 | Netzel | 417/2 X |
| 3,278,113 | 10/1966 | Lundfurs | 417/154 |
| 3,636,974 | 1/1972 | Berguiristain | 137/565 |
| 3,685,539 | 8/1972 | Warren | 137/565 |
| 4,361,418 | 11/1982 | Tscheppe | 417/244 X |
| 4,636,401 | 1/1987 | Yamazaki et al. | 118/719 X |
| 4,648,804 | 3/1987 | Jones et al. | 118/50 X |

FOREIGN PATENT DOCUMENTS

| | | | |
|---|---|---|---|
| 2732696 | 2/1979 | Fed. Rep. of Germany | 417/54 |
| 834117 | 8/1938 | France | 417/306 |
| 104590 | 11/1980 | Japan | 417/152 |
| 883552 | 11/1981 | U.S.S.R. | 417/426 |

Primary Examiner—Carlton R. Croyle
Assistant Examiner—Paul F. Neils

[57] ABSTRACT

Vacuum pumping system comprises a plurality of vacuum processing vessels, semiconductor processing reactors, and the like, connected to a common manifold evacuated by a generously large central vacuum unit. The manifold is maintained at a substantially constant designated pre-set pressure higher than the pressures within the reactors by means of a gas bleed inlet valve controllably feeding an inert gas into the manifold. A blower package with valving, interposed between each reactor and the common manifold, discharges directly into the manifold and prevents pressure surges and excursions in the manifold and reactors as well as permitting each reactor to operate at different pressures independently of the existing manifold pressure.

16 Claims, 1 Drawing Figure

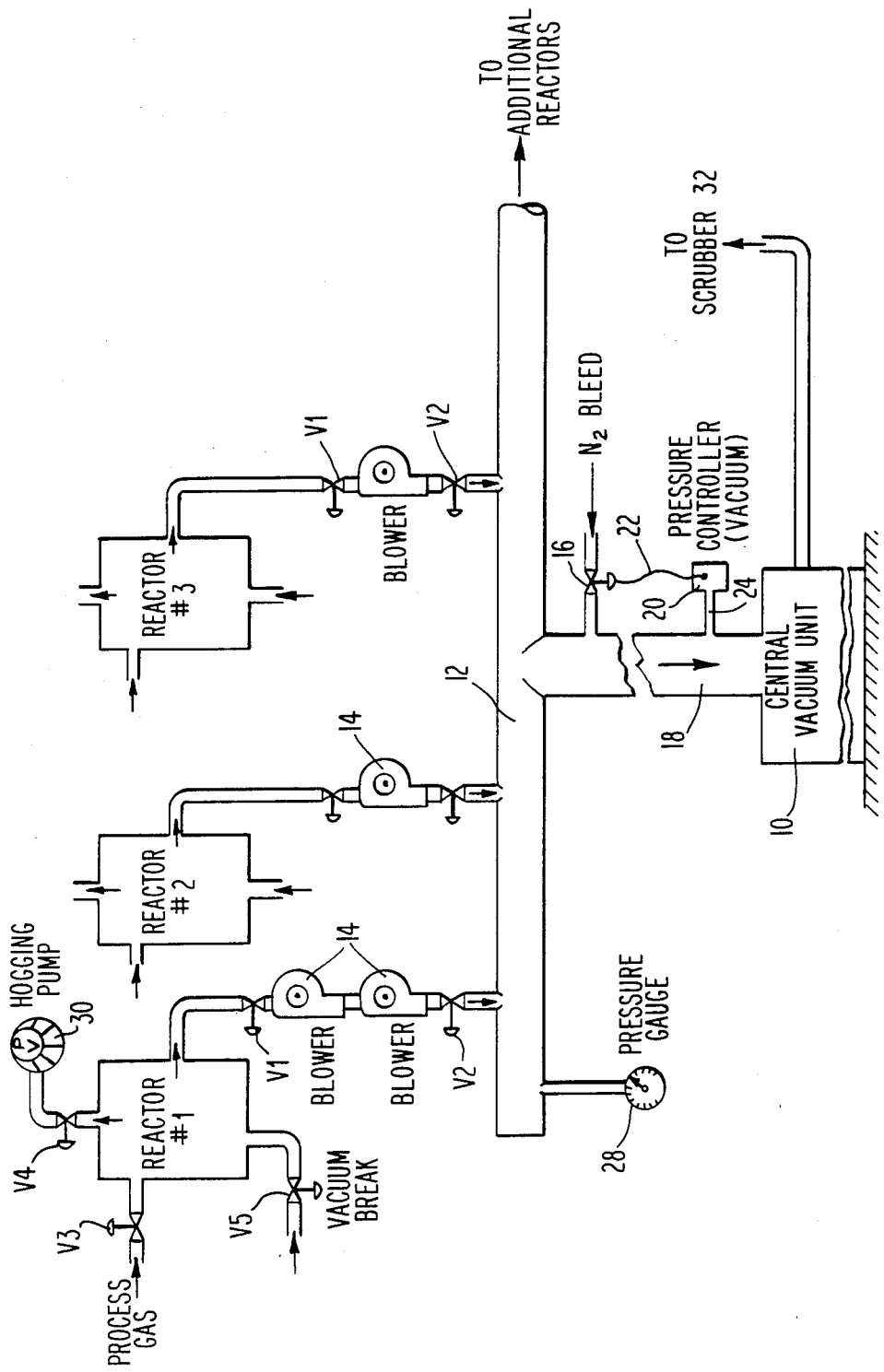

VACUUM MANIFOLD PUMPING SYSTEM

STATEMENT OF THE INVENTION

This invention relates to vacuum pumping systems and more particularly to pumping systems devoid of a multiplicity of oil-sealed vacuum pumps normally required for use in existing semiconductor manufacturing processes, low pressure chemical vapor deposition reactors, and the like, as well as eliminating pressure surges in the reactors which often occur when a plurality thereof are connected to a common manifold.

BACKGROUND AND SUMMARY OF THE INVENTION

Existing vacuum systems for use in many industrial facilities, and more especially in semiconductor plants, for example, require a multiplicity of small oil-sealed vacuum pumps which are costly, and disposed to frequent maintenance problems. The prior art pumping system manifolds, when used, are often subject to pressure upsets and surges which may harm the delicate semiconductor wafers being processed since only very thin films are deposited, removed or doped.

The present system apparatus employs a central vacuum unit which is designed generously large to enable it to accept the loads, with capacity to spare, from a plurality of blower packages, one each of the packages connected to each of the separate reactors, typically low pressure chemical vapor deposition reactor chambers. The central vacuum unit communicates directly with a manifold maintained at a designated constant pre-set intermediate vacuum pressure, i.e., between the pressures at the several reactors and the central vacuum unit. At least one blower or pump, with valving, is interposed between each reactor and the common manifold, and, when discharging into the manifold, eliminates pressure surges in the manifold and reactors while yet permitting each of the reactors to operate at different pressures independently of the higher manifold designated pressure.

The sole FIGURE of the drawing is a diagrammatic schematic illustration of the vacuum pumping system apparatus of the present invention.

DETAILED DESCRIPTION OF THE INVENTION

The central vacuum unit 10 may comprise a single layer vacuum pump such as a dry vacuum pump, a water ring vacuum pump, a large Microvac type oil-sealed vacuum pump, a plurality of blowers, and the like. Vacuum unit 10 must however be of sufficiently large capacity to enable it to handle the load from the entire system while yet maintaining a designated pre-set intermediate vacuum pressure in a common manifold 12 disposed between the central vacuum unit 10 and a plurality of reactors, typically low pressure chemical vapor deposition reactors, designated reactor #1, reactor #2, reactor #3, etc.

Each reactor is associated with a blower package disposed between it and common manifold 12. Thus, reactor #1, for example, is provided with a pair of serially connected blowers or pumps 14, preferably rotary lobe blowers or compressors. Reactor #2, for example, is illustrated with only a single blower 14 in its blower package, since reactor #2 does not require the low pressure required by reactor #1. Blowers 14 are typically controlled from a panel (not shown) on the separate reactors and are preferably variable-speed drive for better process pressure control.

Typical volumes and processing pressures within the reactor chambers may be about 3 to 4 cubic feet and 1 torr respectively.

Manifold 12 is maintained at a designated substantially constant pre-set vacuum pressure, say, from 1 to 10 torr, by means of an inlet gas bleed valve 16 communicating with conduit 18 interconnecting central vacuum unit 10 and manifold 12. The inlet gas is preferably inert, suitably nitrogen, and the vacuum pressure within manifold 12 is maintained at the designated pressure by means of a conventional vacuum pressure control switch 20 connected electrically at 22 to inlet gas bleed valve 16 for activation thereof; i.e., when pressure within manifold 12 falls below the designated pre-set pressure, bleed valve 16 will permit nitrogen or ambient atmosphere, for example, to enter conduit 18 and manifold 12 to raise the manifold pressure to the predetermined prescribed range. Pressure controller 20 communicates with conduit 18 through conduit 24. As mentioned previously, central vacuum unit 10 is intentionally designed for sustained high capacity vacuum performance necessitating bleed valve 16 to often remain continuously open or activated for extended periods in order to maintain the desired vacuum pressure within manifold 12. A gauge 28 provides a visual indication of pressure within the manifold.

Referring to the drawing, and more particularly to reactor #1 thereof, for example, main vacuum valve V1 and maintenance valve V2 are disposed between blower package 14 and the reactor, and blower package 14 and manifold 12 respectively. Process gas control valve V3 controls entry of process gas into the reactor while hogging valve V4 permits hogging pump 30 to evacuate the reactor prior to processing. Since several process gases are pyrophoric, it is desirable that hogging pump 30 evacuate the reactor chamber prior to introduction of any pyrophoric process gas thereinto. A vacuum break valve V5 completes the valving requirements associated with reactor #1. Each of the reactors in the system, up to about 10, or more if needed, is provided with similar valving, although several reactors may share a hogging pump.

Scrubber means 32, typically liquid spray, is employed as shown, since several of the process gases used are considered highly toxic, viz., silane, phosphine, arsine, and the like.

For purposes of discussion, let it be assumed that reactor #1, for example, is to be processed using a pyrophoric gas. The reactor is initially loaded with product, such as silicon wafers, all valves being closed and pumped down. Since the process gas is pyrophoric, central vacuum unit 10 will not be started until hogging pump 30 sufficiently evacuates the reactor chamber. Hogging pump valve V4 may then be closed and the central vacuum unit 10 and blowers 14 started, main vacuum valve V1 and maintenance valve V2 being opened. The nitrogen gas bleed inlet valve 16 will be automatically activated when the manifold pressure falls below the designated pre-set manifold pressure, typically maintained between about 1 to 10 torr. The process gas control valve V3 may now be opened. In a typical embodiment, gas bleed valve 16 would be opened almost continuously to aid in holding the manifold pressure within the designated pre-set limits.

During shut-down of reactor #1, process gas control valve V3 is turned off as well as blowers 14 and main vacuum valve V1. Nitrogen gas, for example, is permitted to be introduced into the reactor chamber by opening vacuum break valve V5. Unless a general plant shut-down is in effect, central vacuum unit 10 will normally remain in operation.

As each reactor in the system now cycles on and off or the load changes in a particular reactor, only an insignificant pressure change will occur in each reactor due to blower(s) 14 associated with each reactor discharging directly into the manifold maintained substantially at a constant predetermined pressure, thereby eliminating a major objection to existing manifolded vacuum systems, i.e. pressure changes and surges in the reactors. Each reactor in the present system thus always discharges via its blower package 14 into a manifold which is maintained at a constant pressure to thereby assure complete independence of each reactor in the system insofar as pressure control within that reactor chamber is involved, i.e., as though each reactor was served by its own vacuum pump.

Some advantages of practicing the present invention are:

(a) The necessity of employing a multiplicity of small vacuum pumps for use in semiconductor reactor systems, for example, is eliminated.

(b) Coupling each reactor of the system through a blower(s) to a common manifold is tantamount to providing each reactor with its own vacuum system, thereby eliminating the negative characteristics existing in current manifolded systems.

(c) Since the central vacuum unit is connected by pipes or conduits to the separate blower(s) associated with each reactor, the central unit may be remotely located where vibration, noise, and other negative characteristics are minimized.

(d) The use of the buffer or isolation blower(s) with valving at each reactor location effectively prevents pressure surges in the common manifold and reactors. The blowers permit each reactor to operate at different pressures independently of the manifold pressure.

(e) Buffer or isolation blowers between the reactors and central manifold serve as pressure buffers to prevent transfer of small pressure surges in the manifold to the reactors as, for example, when a new reactor is opened to the system for pump down. The present buffer blowers insure an absence of harmful pressure excursions in the reactors which are likely to occur in existing systems of the type described.

I claim:

1. A vacuum pumping system comprising
a central vacuum unit,
a plurality of parallel disposed vacuum chambers to be evacuated by said central vacuum unit,
a common manifold disposed between said vacuum chambers and said central vacuum unit,
at least one buffer blower comprising a blower package disposed between each of said vacuum chambers and said common manifold,
first conduit means interconnecting said manifold and central vacuum unit and second conduit means separately interconnecting each of said vacuum chambers with said manifold,
valve means upstream and downstream each of said blower packages in said second conduit means,
said valve means permitting said blower package associated with each of said vacuum chambers, upon activation of selected blower packages, to discharge directly through said second conduit means into said common manifold maintained at a designated pre-set vacuum pressure higher than pressure within said vacuum chambers whereby pressure surges and excursions in said manifold and vacuum chambers are minimized and each of said vacuum chambers is permitted to operate at different pressures independently of pressure within said common manifold.

2. The system of claim 1 wherein said first conduit means is associated with a gas bleed inlet valve whereby pressure within said manifold is increased by gas flowing thereinto through said bleed inlet valve to thereby maintain said pressure within said manifold between designated pre-set limits.

3. The system of claim 2 wherein said pressure is maintained within said designated pre-set limits at about between 1 to 10 torr.

4. The system of claim 3 wherein said pre-set pressure limits are controlled by a pressure controller associated with said gas bleed inlet valve.

5. The system of claim 1 wherein each of said vacuum chambers in provided with third conduit means having a process gas control valve disposed therein for permitting passage of selected process gases into each of said vacuum chambers.

6. The system of claim 1 wherein each of said vacuum chambers is provided with fourth conduit means having a vacuum break valve disposed therein for permitting passage of air into each of said vacuum chambers to break vacuum therein.

7. The system of claim 1 wherein each of said vacuum chambers is provided with fifth conduit means having a hogging pump associated therewith for initially creating a vacuum in each of said vacuum chambers.

8. The system of claim 1 wherein said vacuum chamber comprises a semiconductor processing reactor used for low pressure chemical vapor deposition and etching.

9. The system of claim 1 wherein said buffer blower comprises a rotary lobe type blower.

10. The system of claim 1 wherein said buffer blower comprises a type blower suitable for vacuum pumping service.

11. A vacuum pumping system comprising
a central vacuum unit,
a plurality of parallel disposed vacuum chambers to be evacuated by said central vacuum unit,
a common manifold disposed between said vacuum chambers and said central vacuum unit,
at least one buffer blower comprising a blower package disposed between each of said vacuum chambers and said common manifold,
first conduit means interconnecting said manifold and central vacuum unit,
second conduit means separately interconnecting each of said vacuum chambers with said manifold,
a gas bleed inlet valve associated with said first conduit means,
a pressure controller associated with said gas bleed inlet valve,
said central vacuum unit adapted to provide sufficient negative pressure within each of said vacuum chambers and manifold whereby said pressure controller associated with said gas bleed inlet valve causes gas to enter said gas bleed inlet valve to maintain pressure within said manifold at a designated pre-set pressure above pressures within each of said evacuated vacuum chambers, and valve means upstream and downstream each of said blower packages in said second conduit means, said valve means permitting said blower package associated with each of said vacuum chambers, upon activation of selected blower packages, to discharge directly through said second conduit means into said common manifold maintained at said designated pre-set pressure whereby pressure surges and excursions in said manifold and vacuum chambers are minimized and each of said vacuum chambers is permitted to operate at different pressures independently of pressure within said common manifold.

12. System of claim 11 wherein said gas caused to enter said gas bleed inlet valve is inert and continuously enters said bleed inlet valve.

13. System of claim 12 wherein said inert gas is nitrogen.

14. System of claim 11 wherein said preset pressure in said common manifold ranges between about 1 to 10 torr.

15. System of claim 11 wherein said buffer blower comprises a rotary lobe type.

16. System of claim 11 wherein said buffer blower comprises a blower or pump suitable for vacuum pumping service.

* * * * *